United States Patent
Hung et al.

(10) Patent No.: US 8,253,146 B2
(45) Date of Patent: Aug. 28, 2012

(54) LED DIE HAVING HEAT DISSIPATION LAYERS

(75) Inventors: Tzu-Chien Hung, Hsinchu Hsien (TW); Chia-Hui Shen, Hsinchu Hsien (TW); Chih-Pang Ma, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 144 days.

(21) Appl. No.: 12/888,398

(22) Filed: Sep. 22, 2010

(65) Prior Publication Data
US 2011/0101408 A1 May 5, 2011

(30) Foreign Application Priority Data
Oct. 29, 2009 (CN) .......................... 2009 1 0207173

(51) Int. Cl.
H01L 21/15 (2006.01)
H01L 31/12 (2006.01)
H01L 33/00 (2010.01)

(52) U.S. Cl. ...................... 257/79; 257/95; 257/E33.001
(58) Field of Classification Search ...................... 257/40, 257/79, 81, 85, 95, 99, E39.007, E33.001, 257/E31.127
See application file for complete search history.

(56) References Cited

U.S. PATENT DOCUMENTS
2004/0076016 A1    4/2004   Sato et al.
2005/0001247 A1*   1/2005   Ozawa et al. ................. 257/291
2006/0097274 A1    5/2006   Lee et al.

FOREIGN PATENT DOCUMENTS
CN      1497745 A    5/2004
CN      1790757 A    6/2006

* cited by examiner

Primary Examiner — Hoai V Pham
(74) Attorney, Agent, or Firm — Altis Law Group, Inc.

(57) ABSTRACT

An LED die includes a multi-layer semiconductor with a first surface, a second surface opposite to the first surface, an inclined plane connecting to the first surface and the second surface, a first electrode and a second electrode respectively positioned on the first surface and the second surface, a first heat dissipation layer made of electrically-insulating and thermally conductive material being coated on the first surface and the inclined plane with a first opening exposing the first electrode, and a second heat dissipation layer made of electrically and thermally conductive material being coated on the first heat dissipation layer and contacting and electrically connecting with the first electrode.

13 Claims, 4 Drawing Sheets

LED DIE HAVING HEAT DISSIPATION LAYERS

TECHNICAL FIELD

The disclosure relates to light emitting diodes, and particularly to a light emitting diode die providing heat dissipation layers.

DESCRIPTION OF THE RELATED ART

Light emitting diodes' (LEDs) many advantages, such as high luminosity, low operational voltage, low power consumption, compatibility with integrated circuits, easy driving, long term reliability, and environmental friendliness have promoted their wide use as a light source. Now, light emitting diodes are commonly applied in environmental lighting.

FIG. 1 is a cross section of a related LED chip package module 100 including a planar LED die 102, a heat slug 104, an optical lens 106, a transparent package resin 108, a package material 110, a fluorescent layer 112, an electrode 114, and a connecting wire 116 connecting to the electrode 114 and the LED die 102. While the LED, as an optoelectronic element, converts electric energy to optical and thermal energy, only 15-25% of the electric energy is converted to optical energy with the remainder producing thermal energy. The illuminating region mainly focuses in the LED die 102 of the LED chip package module 100, and the heat collected in the LED die 102 induces non-uniform distribution of thermal stress, lowering illuminating efficiency of LED die 102. When the temperature surpasses a certain value, failure rate of the LED die 102 increases exponentially. Further, the increased temperature inhibits light extraction and lowers reliability and lifetime of the LED.

Such thermal issues with the high power LED require significant heat management solutions. For example, LEDs including GaN, InGaN, and AlInGaN are manufactured on a sapphire substrate. The sapphire substrate, however, having lower thermal conductivity, increases thermal resistance of the LED, creating serious self-heating effect. Thus, another technology is provided. The semiconductor layers which have been manufactured on the sapphire substrate remove the sapphire substrate and replace it with a high thermal conductivity metal substrate providing mechanical support. Heat dissipation of the LED is thus enhanced. In back-end process, the LED chip package module 100 utilizes the heat slug 104 to decrease the thermal impedance of the LED chip package module 100.

However, increased luminous efficiency of the LED gradually produces more heat, which must be evacuated from the LED die 102 to avoid impairing the reliability and lifetime thereof.

Therefore, it is desirable to provide an LED die which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present LED die. Moreover, in the drawings, like reference numerals designate corresponding parts throughout the views.

DETAILED DESCRIPTION

Embodiments of an LED die as disclosed are described in detail here with reference to the drawings.

Figure 1:
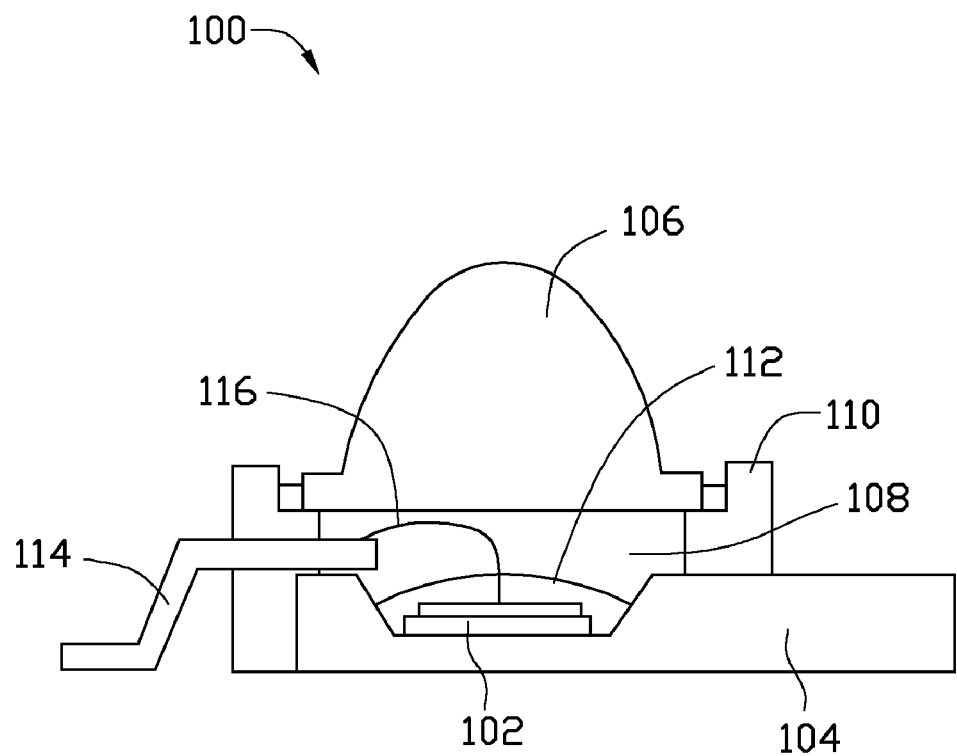
FIG. 1 is a cross section of an LED chip package module in accordance with related art.
Figure 2:
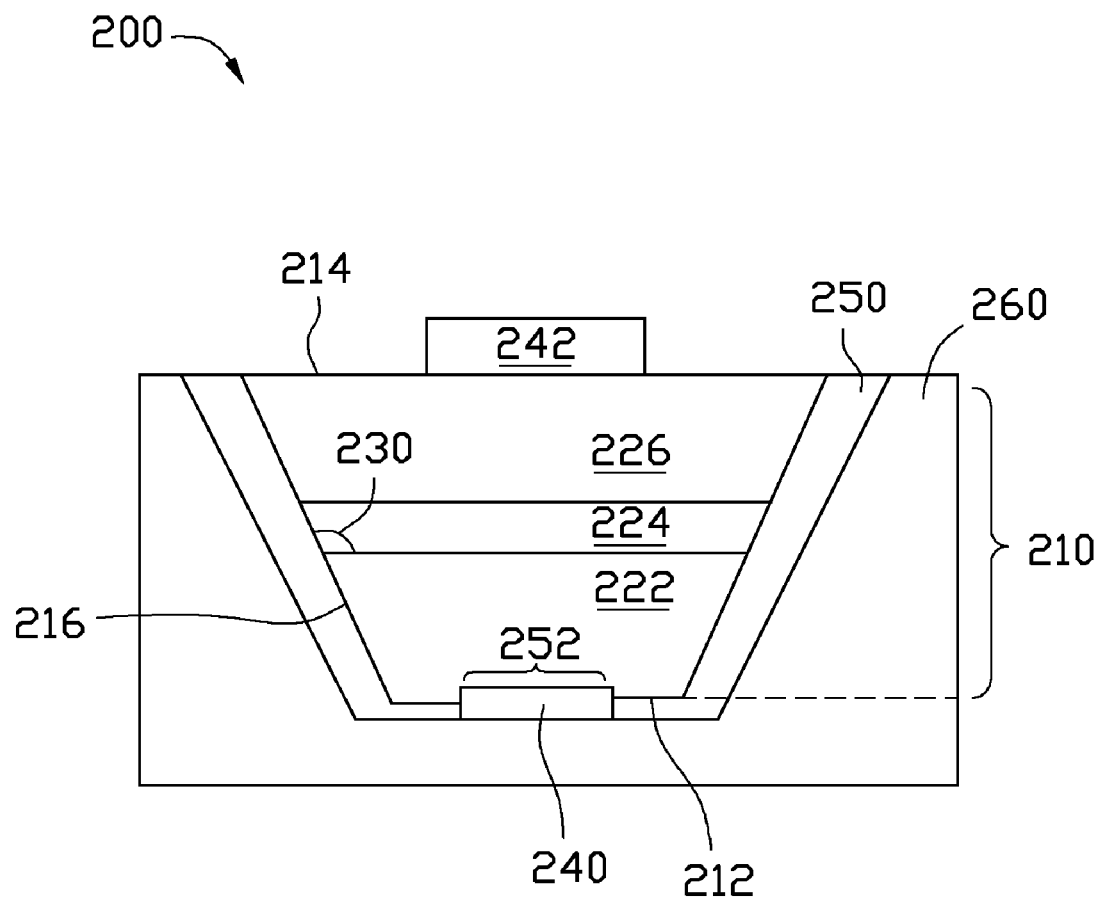
FIG. 2 is a cross section of an LED die in accordance with a first embodiment of the present disclosure.

FIG. 2 shows an LED die 200 having vertical structure including a multi-layer semiconductor 210 having a first surface 212, a second surface 214 opposite to the first surface 212, and an inclined plane 216 connecting to the first surface 212 and the second surface 214. The first surface 212 is a bottom surface and the second surface 214 is a top surface. The multi-layer semiconductor 210 includes a first type semiconductor layer 222, an active layer 224, and a second type semiconductor layer 226. In this embodiment, the first type semiconductor 222, the active layer 224, and the second type semiconductor 226 are respectively GaN, InGaN, and AlInGaN. The first type semiconductor 222 is p type and the second type semiconductor 226 is n type, but are not limited thereto.

The multi-layer semiconductor 210 is fabricated on a sapphire substrate with lattice matching the multi-layer semiconductor 210. The sapphire is replaced with a metal substrate (not shown) having high thermal conduction. The metal substrate provides mechanical support and enhances the heat dissipation of the multi-layer semiconductor 210.

A cross section of the multi-layer semiconductor 210 inverted trapezoid-shaped. Thus, an included angle 230 between the inclined plane 216 and the active layer 224 exceeds 90° and light from the active layer 224 is reflected out the LED die 200. Furthermore, the LED die 200 includes a first electrode 240 and a second electrode 242 respectively arranged on the first surface 212 and the second surface 214. The second electrode 242 on the second surface 214 can electrically connect to external circuitry (not shown) by a connecting wire in back-end process.

Referring still to FIG. 2, the LED die 200 further includes a first heat dissipation layer 250. The first heat dissipation layer 250 forms along the first surface 212 and the inclined plane 216 of the multi-layer semiconductor 210, and covers the first surface 212 and the inclined plane 216. The first heat dissipation layer 250 has a first opening 252 exposing the first electrode 240. The first heat dissipation layer 250 can include a transparent, electrically-insulating material, such as $SiO_x$, $SiO_xN_{(1-x)}$, diamond-like carbon, and $TiO_2$.

A second heat dissipation layer 260 forms on the surface of the first heat dissipation layer 250 by electroplate or evaporation process. Thus, the second heat dissipation layer 260 has an inner profile the same as an outer profile of the first heat dissipation layer 250. The second heat dissipation layer 260 covers the first heat dissipation layer 250 and connects electrically to the first electrode 240 exposing in the first opening 252. The second heat dissipation layer 260 can include electrically conductive material with high thermal conductivity such as Al, Ag, Ni, Ti, Au, Pt, Pd, Cu, Co, alloys thereof, and semiconductor materials. The second heat dissipation layer 260 can also include highly reflective material such that the light from the active layer 224 is reflected through the inclined plane 216. The extraction efficiency of the LED is thus increased. The second heat dissipation layer 260 can be cup shaped. The interior of the second heat dissipation layer 260 covers the multi-layer semiconductor 210, the first electrode 240 and the first heat dissipation layer 250. The exterior of the second heat dissipation layer 260 can still use a planar structure, making it convenient to process the package.

Figure 3:
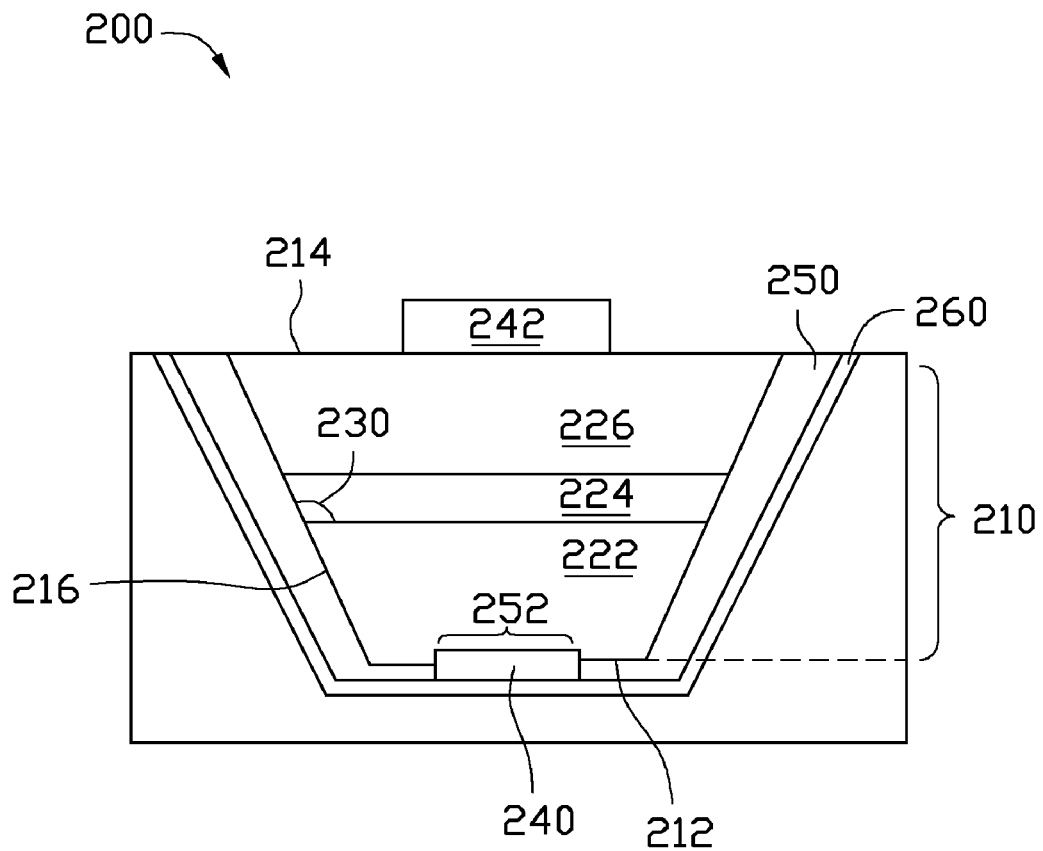
FIG. 3 is a cross section of an LED die in accordance with a second embodiment.

FIG. 3 is a cross section of a second embodiment. An exterior heat dissipation layer 270 is deposited on the second heat dissipation layer 260. The exterior heat dissipation layer 270 is formed along the first surface 212 and the inclined plane 216 of the multi-layer semiconductor 210, and covers the second heat dissipation layer 260. The exterior heat dissipation layer 270 can include electrically conductive material with high thermal conductivity such as Al, Ag, Ni, Ti, Au, Pt, Pd, Cu, Co, alloys thereof, and semiconductor materials. The exterior heat dissipation layer 270, in a cup shape, covers the multi-layer semiconductor 210, the first electrode 240, the first heat dissipation layer 250 and the second heat dissipation layer 260. The exterior of the exterior heat dissipation layer 270 can still use a planar structure, retaining the convenience of processing. The first electrode 240 is exposed through the first opening 252, and electrically connects to the second heat dissipation layer 260 and the exterior heat dissipation layer 270. Thus, the exterior heat dissipation layer 270 is used for electrically connecting the LED die 200 to the external circuitry.

The value of the coefficient of thermal expansion of the second heat dissipation layer 260 is between the value of the exterior heat dissipation layer 270 and the first heat dissipation layer 250.

The multi-layer semiconductor 210 is covered by the first heat dissipation layer 250, the second heat dissipation layer 260, and the exterior heat dissipation layer 270. The first heat dissipation layer 250, the second heat dissipation layer 260, and the exterior heat dissipation layer 270 all include high thermally conductive material, whereby heat produced by the multi-layer semiconductor 210 is conducted to the first heat dissipation layer 250, the second heat dissipation layer 260, and the exterior heat dissipation layer 270 through the first surface 212 and the inclined plane 216. The heat produced by the LED die 200 is rapidly evacuated to the exterior. Moreover, the multi-layer semiconductor 210 of the LED die 200, as an inverted trapezoid, increases the surface area of the first heat dissipation layer 250, the second heat dissipation layer 260, and the exterior heat dissipation layer 270, further enhancing heat dissipation efficiency.

Figure 4:
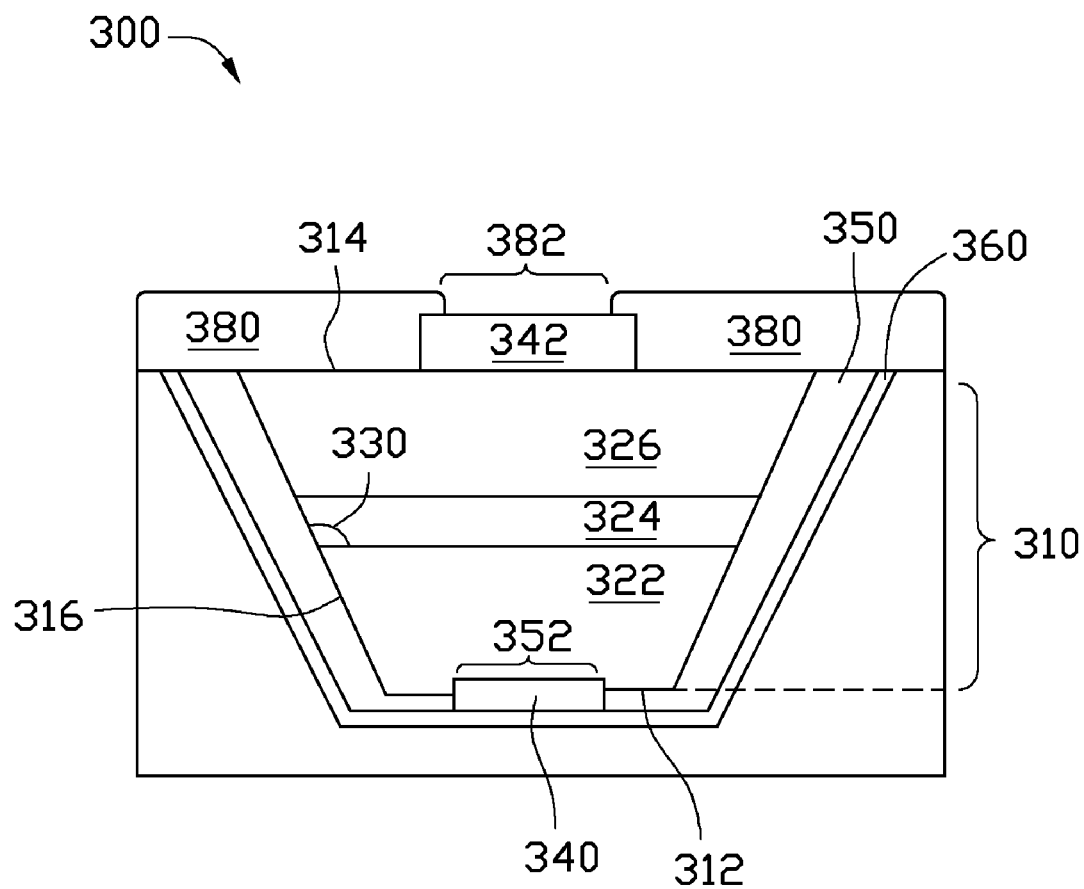
FIG. 4 is a cross section of an LED die in accordance with a third embodiment.

FIG. 4 is a cross section of a LED die 300 of a third embodiment. The LED die 300, having a vertical structure, includes a multi-layer semiconductor 310. The multi-layer semiconductor 310 includes a first surface 312, a second surface 314 opposite to the first surface 312 and an inclined plane 316 connecting to the first surface 312 and the second surface 314. The first surface 312 is a bottom surface and the second surface 314 is a top surface. The multi-layer semiconductor 310 includes a first type semiconductor layer 322, an active layer 324, and a second type semiconductor layer 326. In this embodiment, the first type semiconductor 322, the active layer 324, and the second type semiconductor 326 are respectively GaN, InGaN, and AlInGaN. The first type semiconductor 322 is p type and the second type semiconductor 326 is n type, but are not limited thereto.

The included angle 330 between the inclined plane 316 and the active layer 324 of the multi-layer semiconductor 310 of the LED die 300 exceeds 90°. The light from the active layer 324 is directed out the LED die 300. Furthermore, the LED die 300 includes a first electrode 340 and a second electrode 342 respectively arranged on the first surface 312 and the second surface 314. The second electrode 342 on the second surface 314 electrically connects to the external circuitry by a connecting wire.

The LED die 300 further includes a first heat dissipation layer 350 along the first surface 312 and the inclined plane 316 of the multi-layer semiconductor 310, and coated on the first surface 312 and the inclined plane 316. The first heat dissipation layer 350 has a first opening 352 exposing the first electrode 340.

A second heat dissipation layer 360 is formed on the outside surface of the first heat dissipation layer 350 by electroplate or evaporation. Thus, the second heat dissipation layer 360 has an inner profile the same as an outer profile of the first heat dissipation layer 350. The second heat dissipation layer 360 covers the first heat dissipation layer 350 and connects electrically to the first electrode 340. The first electrode 340 is exposed through the first opening 352 and electrically connects to the second heat dissipation layer 360 and an exterior heat dissipation layer 370.

The exterior heat dissipation layer 370 is deposited on the second heat dissipation layer 360. The exterior heat dissipation layer 370 along the multi-layer semiconductor 310 and the inclined plane 316 covers the second heat dissipation layer 360. The first heat dissipation layer 350 can be transparent, electrically-insulating material, the second heat dissipation layer 360 can be highly electrically and thermally conductive materials and the exterior heat dissipation layer 370 can be Al, Ag, Ni, Ti, Au, Pt, Pd, Cu, Co, alloys thereof, or semiconductor materials.

The second heat dissipation layer 360 is highly reflective, such that the second heat dissipation layer 360 reflects the light from the inclined plane 316 of active layer 324.

The interior of the exterior heat dissipation layer 370 is cup shaped and covers the multi-layer semiconductor 310, the first electrode 340, the first heat dissipation layer 350, and the second heat dissipation layer 360. The exterior of the exterior heat dissipation layer 370 can still use a planar structure, retaining convenience of packaging.

The LED die 300 of the third embodiment further includes a heat dissipation layer 380 on the second surface 314 of the multi-layer semiconductor 310 and covering the second surface 314. The heat dissipation layer 380 has a second opening 382 exposing the second electrode 342. The second electrode 342 electrically connects to the external circuitry by wire during package process. The heat dissipation layer 380 can be a transparent, electrically-insulating material, such as $SiO_2$, $Si_3N_4$, diamond-like carbon, or $TiO_2$. The heat dissipation layer 380 on the second surface 314 dissipates heat from the multi-layer semiconductor 310. Because the heat dissipation layer 380 contacts the second surface 314, the first heat dissipation layer 350, the second heat dissipation layer 360 and the exterior heat dissipation layer 370, heat from the multi-layer semiconductor 310 is conducted to the heat dissipation layer 380 through the second surface 314 and dissipates through the heat dissipation layer 380.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An LED die, comprising:
a multi-layer semiconductor comprising a first surface, a second surface opposite to the second surface and an inclined plane connecting to the first surface and the second surface;

a first electrode and a second electrode respectively deposited on the first surface and the second surface;

a first heat dissipation layer covering the first surface and the inclined plane of the multi-layer semiconductor and comprising a first opening exposing the first electrode, the first heat dissipation layer being electrically insulating and thermally conductive; and a second heat dissipation layer covering the first heat dissipation layer and electrically connecting to the first electrode, the second heat dissipation layer being electrically and thermally conductive.

2. The LED die of claim 1, wherein the multi-layer semiconductor includes a first type semiconductor layer, an active layer and a second type semiconductor layer.

3. The LED die of claim 2, wherein a cross section of the multi-layer semiconductor is an inverted trapezoid.

4. The LED die of claim 3, wherein an included angle between the active layer and the inclined plane exceeds 90°.

5. The LED die of claim 1, wherein the first heat dissipation layer is transparent.

6. The LED die of claim 5, wherein the first heat dissipation layer is formed by a material selected from the group consisting of $SiO_x$, $SiO_xN_{(1-x)}$, diamond-like carbon, and $TiO_2$.

7. The LED die of claim 1, wherein the second heat dissipation layer is formed by a material selected from the group consisting of Al, Ag, Ni, Ti, Au, Pt, Pd, Cu, Co, alloys thereof, and semiconductor material.

8. The LED die of claim 1, further including an exterior heat dissipation layer covering the second heat dissipation layer.

9. The LED die of claim 8, wherein the exterior heat dissipation layer includes one of metal and semiconductor material.

10. The LED die of claim 1, wherein the LED die further includes a surface heat dissipation layer covering the second surface of the multi-layer semiconductor.

11. The LED die of claim 10, wherein the surface heat dissipation layer includes a second opening exposing the second electrode.

12. The LED die of claim 10, wherein the surface heat dissipation layer includes a transparent, electrically-insulating material.

13. The LED die of claim 12, wherein the transparent, electrically-insulating material is selected from the group consisting of $SiO_x$, $SiO_xN_{(1-x)}$, diamond-like carbon, and $TiO_2$.

* * * * *